Jan. 13, 1970 I. M. HYMES ET AL 3,488,840

METHOD OF CONNECTING MICROMINIATURIZED
DEVICES TO CIRCUIT PANELS
Original Filed Dec. 27, 1963

INVENTORS

IRWIN M. HYMES
RAEMAN P. SOPHER
PAUL A. TOTTA

BY

ATTORNEY

United States Patent Office 3,488,840
Patented Jan. 13, 1970

3,488,840

METHOD OF CONNECTING MICROMINIATURIZED DEVICES TO CIRCUIT PANELS

Irwin M. Hymes, Wappingers Falls, and Raeman P. Sopher and Paul A. Totta, Poughkeepsie, N.Y., assignors to International Business Machines Corporation, Armonk, N.Y., a corporation of New York Original application Dec. 27, 1963, Ser. No. 333,863, now Patent No. 3,303,393, dated Feb. 7, 1967. Divided and this application Oct. 3, 1966, Ser. No. 583,536
The portion of the term of the patent subsequent to Dec. 20, 1983, has been disclaimed
Int. Cl. H05k 3/34
U.S. Cl. 29—626 4 Claims

ABSTRACT OF THE DISCLOSURE

A connection between a microminiature circuit element and a conductive path on a substrate whereby the circuit element is superposed relative to the conductive path. The circuit element includes a laminated metallic pad, the pad having an outer layer which is wettable by solder. A non-deformable and wettable by solder terminal element is bonded to the outer layer of the pad. The conductive path, either a portion or entirely, is coated with solder after the terminal element is placed in juxtaposition to the conductive path, the substrate and circuit element being heated to fuse the terminal element to the conductive path.

This is a division of application Ser. No. 333,863, filed Dec. 27, 1963, now Patent No. 3,303,393.

This invention relates to microminiaturized circuit elements. More particularly, the invention relates to terminals for microminiaturized elements employed in microelectronic circuits and methods of connecting same to circuit panels.

Microelectronic circuits, in one form, are combinations of microminiaturized circuit devices or elements, i.e., active and passive elements which are secured to a substrate having a defined conductive pattern thereon for interconnecting the elements to provide a desired logical function. Combinations of microelectronic circuits are suitably interconnected to process data in an information handling system.

The physical size of microelectronic circuits is of the order of one-half inch by one-half inch and they must be readily fabricated at commercially acceptable yields. The elements included in the microelectronic circuits are as small as 25 mils by 25 mils. The elements must be connected through microscopic terminals to the substrate. It is essential such terminals provide good electrical and mechanical connections therebetween and the joint between the terminal and the substrate be capable of withstanding high thermal and vibration stresses.

A general object of the invention is a terminal arrangement for microminiaturized or chip devices which facilitates connections to microelectronic circuits.

One object is a highly reliable joint of microscopic size and excellent mechanical and electrical characteristics formed between a microminiaturized device and a microelectronic circuit.

Another object is a microminiaturized circuit element that may be joined to a microelectronic circuit and positively spaced from the circuit.

Still another object is a method of attaching chip elements to a substrate.

These and other objects of the present invention are accomplished in the present invention, one illustrative embodiment of which comprises a wettable and high melting temperature conductive element, typically a spherical copper ball of the order of 5–6 mils in diameter, joined to the electrodes of a circuit element approximately 25 mils by 25 mils in dimension. The conductive element or copper ball forms the terminals of a circuit element which may be of a planar or other configuration. (Planar elements have all terminals in the same plane. Other elements have terminals in more than one plane.) The circuit element is superposed with respect to a substrate having a defined conductive pattern thereon. The conductive pattern includes fingers for accommodating the circuit element. The conductive pattern on the substrate is solder coated to provide metal for a solder reflow joint between the conductive pattern and the circuit element terminals. When the substrate with the circuit element positioned on the fingers is heated in an oven, the solder will melt to establish a solder reflow joint between the circuit element terminals and the conductive pattern. The terminal elements are a "wettable" material, i.e., solder adherent, and are substantially unaffected by the temperature required for melting the solder. The "wettable" nature of each terminal element permits the melted solder to rise up its sides so that upon subsequent cooling a strong mechanical and good electrical connection is established between each terminal element and the solder. Each terminal element being unaffected by the oven temperature, provides a mechanical support for the circuit element and positively spaces the elements above the conductive pattern. In the case of semiconductors, such a positive displacement prevents the junctions thereof from being short-circuited by engaging the conductive pattern. It also permits cleaning under the chip and subsequent application of protective material, if desired. The solder reflow joint, when prepared as described hereinafter, has been found to be mechanically strong and electrically reliable at relatively high thermal and vibration stresses. The temperature insensitivity of the terminal elements permits the joints to be effected without precise control of temperature conditions. Thus, a microminiaturized circuit element may be easily and rapidly jointed in a microelectronic circuit, in a readily reproducible manner, suitable for mass production techniques.

One feature of the present invention is a terminal for a microminiaturized circuit element of planar configuration that may be readily joined to a microelectronic circuit by a solder reflow process.

Another feature is a circuit element having a terminal that is wettable and substantially temperature insensitive while being joined to a microelectronic circuit in a solder reflow process.

Still another feature is a circuit element having spherically shaped terminals which may be joined to a microelectronic circuit to provide mechanical and electrical inter-connections therebetween and positive displacement with respect to the microelectronic circuit.

The foregoing and other objects, features and advantages of the invention will be apparent from the following more particular description of a preferred embodiment of the invention, as illustrated in the accompanying drawing.

Figure 1:
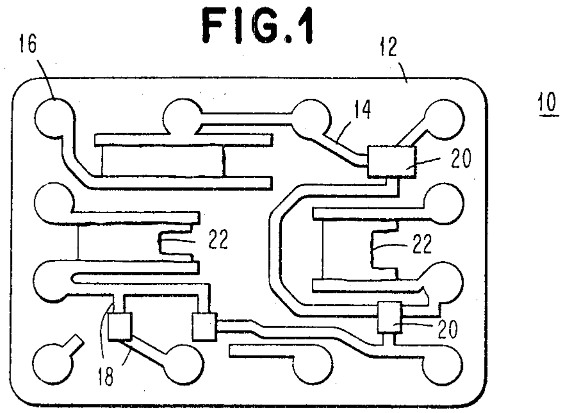
FIGURE 1 is a plan view of a microelectronic circuit with various circuit elements joined thereto.

A microelectronic circuit 10, shown in FIGURE 1, comprises a substrate 12 having a conductive pattern 14 thereon and a plurality of terminal means 16 spaced about the periphery of the substrate. The conductive pattern 14 has a line width of 10–15 mils and includes fingers 18 (see FIGURE 4) of the order of 3 mils with spacings therebetween for receiving microminiaturized circuit elements 20 and 22 which may be active or passive in nature, respectively. The details of fabricating a microelectronic circuit 10 are described in a previously filed application, Ser. No. 300,734, filed Aug. 8, 1963, and assigned to the same assignee as that of the present invention. The details of fabricating an improved circuit element terminal connection for such a circuit is the subject of the present invention.

Passive or active circuit elements may be joined to fingers 18 by a solder reflow process which provides good electrical and mechanical interconnections between the element 20 and the conductive pattern 14. Active circuit elements, as one device that may be connected to the conductive pattern, are described in a paper entitled "Hermetically Sealed Chip Diodes and Transistors" by J. L. Langdon, W. E. Mutter, R. P. Pecoraro and K. K. Schuegraph, which was presented at the 1961 Electron Device Meeting in Washington, D.C., on Oct. 27, 1961.

Passive elements may be of film construction as described in the application, Ser. No. 300,734, filed Aug. 8, 1963, previously referred to, or they may also be of a chip configuration as in the case of the active circuit elements. Fabrication of passive elements in chip form is well known in the art as described for example in an article entitled "Microminiaturized Capacitor Fabrication," by E. M. Davis, Jr., which appeared in the IBM Technical Disclosure Bulletin, March 1963, volume 5, No. 10, page 115.

Figure 2:
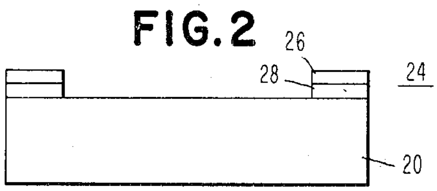
FIGURE 2 is a cross-sectional view of a circuit element adapted to receive a terminal member.

Referring to FIGURE 2, a chip element 20, which may be of the order of 25 mils by 25 mils and either passive or active in nature, is adapted to have metallic pads 24 at appropriate electrode points. The pads 24 are adapted to be joined to a terminal element as will be described hereinafter. To effect a good electrical and mechanical connection between the circuit element and a terminal element, the pads may comprise a plurality of layers of metal, usually vapor deposited, for effecting such a connection. An outer layer 26 of the pad 24 is a solderable material, typically a 95% lead and 5% tin combination, for receiving the terminal member. An inner layer 28 of metal is such as to effect a strong mechanical and electrical connection to both the surface of the element 20, which may be ceramic-like, and the solderable metal. In certain instances, it may be necessary to provide a third metal layer to suitably interconnect the solder to the inner layer. Once the conductive pads 24 are fabricated, a terminal element may be secured thereto.

Figure 3:
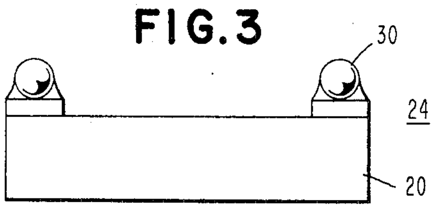
FIGURE 3 is a cross-sectional view of a circuit element with the terminal members in place.

Referring to FIGURE 3, a terminal element 30 is shown joined to each conductive pad 24. The terminal is joined to the element 20 by conventional thermal bonding technique, and establishes an ohmic connection to the element. The terminal element is a wettable material, for example, copper, nickel or the like, for effecting the connection to the pads 24. Alternatively, the terminal element may be a conductive ceramic, for example, a highly doped semiconductor, which functions in a corresponding manner to copper, nickel and the like. Also, the terminal may be an insulator coated with a wettable metal film. The selected terminal material, in any case, should be relatively insensitive to temperature during the soldering or joining process. This requirement is of particular importance, as will be pointed out hereinafter in joining the circuit element to a microelectronic circuit. The terminal may also be of any geometrical configurations, i.e., spherical, parallelepiped or the like. All forms of geometrical terminal configurations, whether solid or ball-type, have been found satisfactory, but a solid spherical terminal of the order of 5–6 mils in diameter is preferred, since it provides a point contact to the microelectronic conductive lands 14, which are of the order of 10–15 mils in width.

Figure 4:
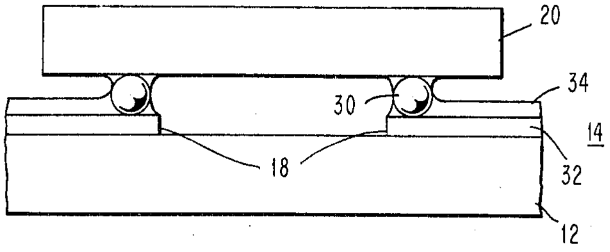
FIGURE 4 is a cross-sectional view of a circuit element joined to the microelectronic circuit.

Referring to FIGURE 4, the chip component, which has a planar configuration, i.e., terminals on one surface of the chip, is joined to the microelectronic circuit. The conductive pattern 14 of the microelectronic circuit comprises a conductive land 32, for example, silver or a gold-platinum alloy, which is covered by a solder coating 34. The solder coating 34 provides metal sufficient to establish a solder reflow joint between the chip 20 and the land 32.

The chip component 20 is placed at the fingers 18 with the terminals 30 engaging the solder coated lands 14. Prior to a heating process, the chip is held in place, as described in the previously filed application, Ser. No. 300,734, filed Aug. 8, 1963, assigned to the same assignee as that of the present invention. When the circuit and component are placed in an oven, the solder melts and rises up the sides of the terminal 30, due to the wettable nature thereof, as is known in the solder reflow art. Typically, but not exclusively, when the coating 34 is a 90% lead and 10% tin solder and the terminal 30 is 5–6 mil spheroid of oxygen-free high conductivity (OFHC) copper, the solder reflow joint is effected at a temperature of the order of 320° C. for a period of 5 minutes. During the heating cycle, the solder pad 24 does not melt since the solder is a 95% lead and 5% tin combination which has a higher melting temperature than 90% lead and 10% tin solder of the land. The 95–5 solder commences to melt at 320° C. and laboratory experience indicates the five minute oven cycle is not long enough for the solder pad 24 to melt. Although 95–5 and 90–10 solders have been disclosed, it is apparent that other hierarchical metal systems exist and provide equivalent results.

The circuit is removed from the oven at the end of the heating cycle and cooled by air or other means to solidify the joint about the terminal. The copper ball terminal has a melting temperature of the order of 1980° F. and is not altered physically during the heating and cooling cycle. Since the terminal is substantially unaffected, shapewise, by the heating cycle, a positive standoff is established between the component 20 and the circuit pattern 14. This feature is of particular significance when the chip is an active element since a junction or other portion of the device may be short-circuited if brought into contact with the conductive pattern 14 by a temperature melting ergo collapsing terminal element. Additionally, the temperature insensitivty of the terminal 30 permits fabrication of a solder reflow joint with little or no requirement for a controlled temperature cycle as described in a previously filed application, Ser. No. 300,855, filed Aug. 8, 1963, now Patent No. 3,292,240. The final joint between the device 20 and the circuit 10 has been found to have good electrical and mechanical characteristics. The resistance of such joints has been found to be of the order of 10 milohms which is especially desirable for microelectronic circuits operating in a low voltage environment, three volts. The mechanical strength of the joint has been tested at 300 grams (for three balls of a device in tension) and found to be reliable for loads up to 180 grams.

Each of the described operations and the process is readily suitable for mass production techniques. Laboratory experience indicates that the mass production techniques for such terminals and connections may be practiced at commercially acceptable yields thereby making microelectronic circuits more readily available to the business, scientific and governmental communities.

While the invention has been particularly shown and described with reference to a preferred embodiment thereof, it will be understood by those skilled in the art that the foregoing and other changes in form and details may be made therein without departing from the spirit or scope of the invention.

What is claimed is:

1. A method of making a connection between a microminiaturized circuit element and a conductive path on a substrate, whereby the circuit element is positively spaced from the conductive path, said method comprising forming a laminated metallic pad on the circuit element, said pad having an outer layer which is wettable by solder, bonding a non-deformable and wettable by solder terminal element to the metallic pad wherein the terminal element is attached to the metallic pad, coating at least a portion of the conductive path with solder placing the terminal element in juxtaposition to the conductive path, and heating the substrate and circuit element to fuse the terminal to the conductive path.

2. The process defined in claim 1 wherein the outer layer of metal on the laminated pad is solder.

3. The method described in claim 1 wherein outer layer of solderable metal on the metallic pad has a first melting temperature and the coating on the conductive path has a second melting temperature which is less than the melting temperature of the outer layer, the heating cycle being limited to a time interval to permit only the coating to melt in establishing a solder reflow joint.

4. The method defined in claim 3 wherein the outer layer of the metallic pad is a 95% lead and 5% tin solder and the coating on the conductive paths is a 90% lead and 10% tin solder, the heating cycle occuring at a temperature not exceeding 320° C. for a period of five minutes.

References Cited

UNITED STATES PATENTS

| | | | |
|---|---|---|---|
| 3,148,310 | 9/1964 | Feldman | 29—625 X |
| 3,241,011 | 3/1966 | De Mille et al. | |
| 3,292,240 | 12/1966 | McNutt et al. | 29—624 X |

JOHN F. CAMPBELL, Primary Examiner

D. C. REILEY, Assistant Examiner

U.S. Cl. X.R.

29—577, 589, 628